(12) United States Patent
Yamashita et al.

(10) Patent No.: US 8,993,877 B2
(45) Date of Patent: Mar. 31, 2015

(54) SOLAR BATTERY

(75) Inventors: Masamichi Yamashita, Otsu (JP); Takashi Iwade, Otsu (JP); Toyoharu Terada, Otsu (JP); Takayoshi Fujimoto, Otsu (JP)

(73) Assignee: Toray Engineering Co., Ltd., Tokyo (JP)

(*) Notice: Subject to any disclaimer, the term of this patent is extended or adjusted under 35 U.S.C. 154(b) by 22 days.

(21) Appl. No.: 13/378,908

(22) PCT Filed: Jun. 16, 2010

(86) PCT No.: PCT/JP2010/060236
§ 371 (c)(1),
(2), (4) Date: Dec. 16, 2011

(87) PCT Pub. No.: WO2010/150692
PCT Pub. Date: Dec. 29, 2010

(65) Prior Publication Data
US 2012/0085407 A1    Apr. 12, 2012

(30) Foreign Application Priority Data

Jun. 23, 2009   (JP) ................................. 2009-149170

(51) Int. Cl.
*H01L 31/00*    (2006.01)
*H01L 31/048*    (2014.01)

(52) U.S. Cl.
CPC ............... *H01L 31/048* (2013.01); *Y02E 10/50* (2013.01)
USPC ........................................ 136/256; 136/251

(58) Field of Classification Search
CPC .............. H01L 31/048; H01L 31/0487; H01L 27/1422–27/1427
USPC .................................................. 136/243–265
See application file for complete search history.

(56) References Cited

U.S. PATENT DOCUMENTS 4,684,761 A * 8/1987 Devaney ........................ 136/258
4,772,335 A * 9/1988 Huang .......................... 136/258
(Continued)

FOREIGN PATENT DOCUMENTS

JP  55-108780 A   8/1980
JP  59072781      4/1984
(Continued)

OTHER PUBLICATIONS

International Search Report for PCT/JP2010/060236, Dated: Jul. 13, 2010.
(Continued)

*Primary Examiner* — Jeffrey T Barton
*Assistant Examiner* — Niki Bakhtiari
(74) *Attorney, Agent, or Firm* — Edell, Shapiro & Finnan, LLC

(57) ABSTRACT

A solar battery module has a structure in which a solar battery cell formed by a transparent electrode, a power generating element, and a back electrode is formed on a substrate, and it is sealed with a resin material such as EVA. However, there has been a problem that water enters from a gap between the substrate and a resin sealing material, thereby resulting in the corrosion of the resin or the solar battery cell. A barrier layer made of inorganic substances having portions in contact with the substrate and the second electrode is provided. Here, the barrier layer is formed by laminating at least $SiO_2$ and an inorganic layer having a lower density than $SiO_2$, and the film having a lower density than $SiO_2$ is directly formed on the substrate and the second electrode.

4 Claims, 5 Drawing Sheets

(56) References Cited

U.S. PATENT DOCUMENTS

| | | | |
|---|---|---|---|
| 5,021,099 A * | 6/1991 | Kim et al. | 136/249 |
| 6,066,796 A * | 5/2000 | Itoyama et al. | 136/251 |
| 2010/0294349 A1 * | 11/2010 | Srinivasan et al. | 136/255 |

FOREIGN PATENT DOCUMENTS

| | | |
|---|---|---|
| JP | 59-076481 A | 5/1984 |
| JP | 64-072568 A | 3/1989 |
| JP | 10200143 | 7/1998 |
| JP | 2000-174296 A | 6/2000 |
| JP | 2001-148496 A | 5/2001 |
| JP | 2004-055970 A | 2/2004 |
| JP | 2008091532 | 4/2008 |
| TW | 302553 B | 4/1997 |
| WO | 98/38683 | 2/1998 |
| WO | 2010087320 A1 | 8/2010 |

OTHER PUBLICATIONS

Japanese Office Action, Sep. 30, 2013, 3 pages.

Office Action for Taiwanese Application No. 099119614, dated Dec. 11, 2014, 4 pages.

* cited by examiner

SOLAR BATTERY

TECHNICAL FIELD

The present invention relates to a solar battery module formed by providing a transparent electrode film and a solar battery power generating element on a substrate and covering them with a protective film in which a barrier layer is provided in order to prevent water entered from a connecting portion between the substrate and the protective film from corroding electrical wiring, the solar battery power generating element, the transparent electrode film, and the like.

BACKGROUND ART

Depletion in fossil energy resources has been of concern in recent years, and alternative new energies have been studied. Photovoltaic generation is especially attracting attention as a promising energy resource. As a method of photovoltaic generation, a crystal solar battery using a monocrystalline silicon, a polycrystalline silicon, or the like, and a thin film solar battery using an amorphous silicon or the like have been known. Since the thin film solar battery needs less row material per unit area, its low cost has been attracting attention.

The thin film solar battery module includes, on a substrate typically made of a glass, a solar battery cell formed by a transparent electrode layer made of a transparent conductive oxide such as ITO, $SnO_2$, or ZnO, a photoelectric conversion layer made of an amorphous silicon or the like, and a back electrode layer made of a metal such as Al, Ag, or Cr. A plurality of solar battery cells are provided on the substrate, and these solar battery cells are connected together in series or in parallel for integration.

On a back surface of the solar battery cell, a sealing layer made of a thermosetting resin such as ethylene-vinyl acetate copolymer (EVA), and a protective layer made of polyvinyl fluoride or using a composite film containing polyvinyl fluoride are laminated. The substrate and this laminate are crosslinked and cured by further heating and melting the sealing layer or sealed by using a vacuum laminating method or the like, thereby obtaining a solar battery module.

The reason why EVA is used here as the sealing layer is that the refractive index of EVA is close to that of a glass and it is inexpensive. However, weathering characteristics of EVA, such as water resistance, moisture resistance, and alkali resistance, are poor. Therefore, water has been easily entered from a side surface of the solar battery module. If water enters inside the solar battery module, not only the sealing layer made of a resin layer but also the electrical wiring, the electrode layer, and the photoelectric conversion layer are likely to corrode. That is, there has been a problem that the long-term reliability is reduced.

The cost of solar battery power generation can be regarded also as the cost/life of a solar battery. If the life of a solar battery is shortened, the cost is increased, thereby preventing the spread of solar battery power generation as an alternative energy to the fossil energy resources. Therefore, various proposals have been made regarding an improvement in the long-term reliability.

For example, Patent Literature 1 discloses a technique using a cover material in which a transparent high moisture-proof film and a transparent highly light-resistant film excellent in ultraviolet light resistance are integrally laminated.

Moreover, Patent Literature 2 discloses a technique in which a tetrafluorinated ethylene-tetrafluoroethylene copolymer, which is an ethylene-tetrafluoroethylene copolymer (ETFE) and has a surface composition by ESCA such that an amount of oxygen is in a range of 5 to 15 at % and an amount of nitrogen is in a range of 1 to 3 at %, or a tetrafluorinated ethylene-hexafluoropropylene copolymer (FEP) is used as a surface protecting material.

Moreover, Patent Literature 3 discloses a sealing structure formed by a main sealant covering a central part of a back surface of a solar battery cell, and a water vapor barrier material covering a peripheral part of the back surface. Here, the water vapor barrier material has a characteristic such that the water vapor transmission rate is 1 $g/m^2 \cdot day$ per 100 μm of film thickness.

Citation List

Patent Literature

Patent Literature 1: Japanese Patent Application Laid-Open No. 2000-174296
Patent Literature 2: Japanese Patent Application Laid-Open No. 2004-055970
Patent Literature 3: Japanese Patent Application Laid-Open No. 2001-148496

SUMMARY OF INVENTION

Technical Problem

A resin used for a sealing layer or a protective layer cannot completely prevent the entering of water vapor even if a composite film is used or a modifying process is performed thereto. Since a solar battery module is exposed to direct sunlight for a long period of time, if water enters inside a layering structure of the solar battery module, electrical wiring corrodes due to the water, or water expands, thereby damaging the structure itself. Moreover, since the solar battery module receives high energy rays such as ultraviolet rays, the resin is especially easy to be decomposed or modified. Therefore, with the methods of the literatures introduced above, even if there is a certain level of effect, it is difficult to dramatically improve prolonging of a life of a solar battery module as long as a resin is used for the sealing layer or the protective layer.

Solution to Problem

The present invention has been conceived to achieve the object of prolonging a life of a solar battery module. Specifically, the purpose of the present invention is to provide a solar battery having a substrate; a first electrode formed on the substrate; a power generating element formed so as to be connected with the first electrode; a second electrode formed so as to be connected with the power generating element; and an inorganic barrier layer having portions at least in contact with the substrate and the second electrode; a first extraction terminal connected to the first electrode; a second extraction terminal connected to the second electrode; and a resin portion that seals the first extraction terminal and the second extraction terminal.

Moreover, the solar battery is configured such that the barrier layer is formed by sequentially depositing a plurality of inorganic layers having different densities.

Further, the solar battery is configured such that the barrier layer has a first inorganic layer which has a low density and is directly formed on the substrate and the second electrode, and a second inorganic layer which has a higher density than the first inorganic layer and is directly formed on the first inorganic layer.

Advantageous Effects of Invention

In a case of the solar battery having the above-described configuration, since the barrier layer is formed by inorganic substances, entering of water can be reduced in several orders of magnitude as compared to the case where sealing is achieved by a resin.

Moreover, since an inorganic substance has a large Young's modulus in general, the stress due to thermal expansion becomes larger than that in a case of a resin. Therefore, if an inorganic substance is used as a sealing material, there is generated a large stress between the inorganic substance and the solar battery cell. Thus, peel-off of the solar battery cell from the substrate or the interlayer is of concern. With the solar battery module of the present application, however, since the inorganic layer having a low density and the inorganic layer having a high density are alternately laminated, it is possible to prevent the entering of water while absorbing the stress between the inorganic layers and the solar battery cell. Further, as extraction terminal connected to electrodes are covered with a resin, and large level difference and gaps between the extraction terminals and the electrodes are eliminated, a CVD method can be used.

DESCRIPTION OF EMBODIMENTS

Figure 1:
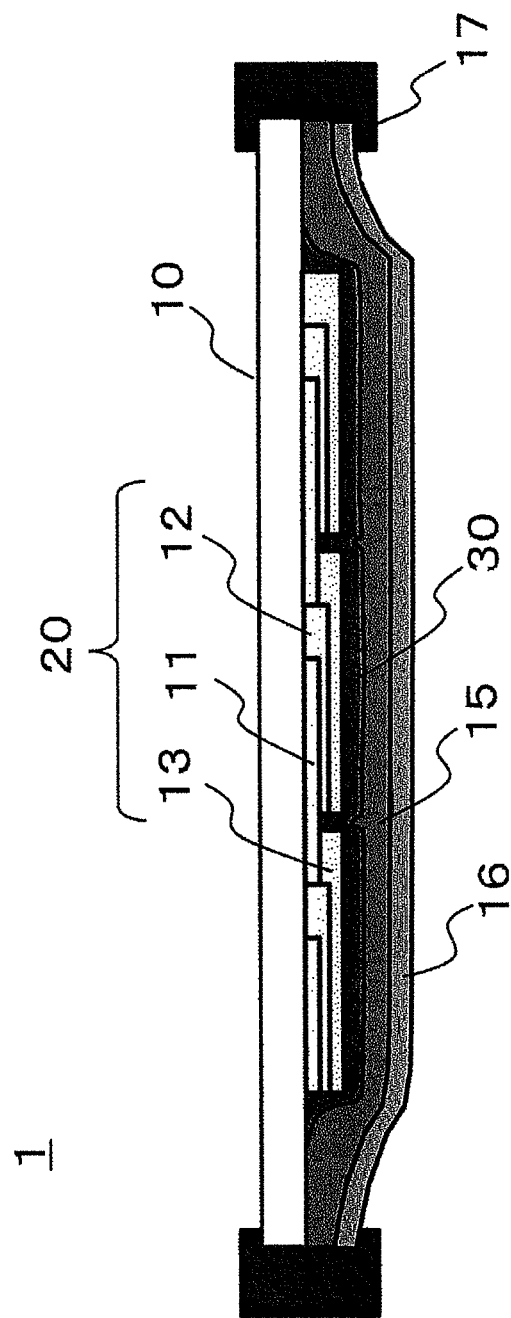
FIG. 1 is a cross-sectional view of a solar battery module of the present invention.

FIG. 1 shows a cross-sectional view of a solar battery module of the present invention. A solar battery module 1 of the present invention includes a substrate 10, a transparent electrode layer 11, a photoelectric conversion layer 12, a back electrode layer 13, and a barrier layer 30. The solar battery module 1 may further include a sealing layer 15, a protective layer 16, and a frame bar 17. Note that a side where the substrate 10 exists is referred to as a front surface of the solar battery module 1, and the opposite side is referred to as a back surface.

Typically, a glass is preferably used as the substrate 10. This is because the photoelectric conversion layer 12 can be irradiated with sunlight due to the transparency of the glass. This is also because a glass has a high weather resistance, and corrosion thereof due to heat, light, or water is less likely to occur. Depending on an element contained therein, a glass can be an optical filter. Therefore, it may be a glass which selectively allows the passage of light with a wavelength range in which a power generation efficiency of the photoelectric conversion layer 12 is excellent. Moreover, an antireflection film may be provided on the substrate, or a metal layer such as a Cr layer for improving adhesiveness may be provided in the vicinity of an edge of the substrate. In the present invention, inorganic layers provided between the solar battery cell and the substrate can all be regarded as a substrate.

The transparent electrode 11 is the first electrode patterned on the substrate 10. FTO (tin oxide containing fluorine), ITO (indium oxide containing tin oxide), $SnO_2$ (tin oxide), ZnO (zinc oxide), or the like, is preferably used, although it is not particularly limited to these. The transparent electrode formed on the substrate does not interfere with light supplied to the photoelectric conversion layer. Therefore, there is obtained an effect of preventing a reduction in the power generation efficiency.

The photoelectric conversion layer 12 is not particularly limited, and any of a thin film type and a bulk type may be used. For example, an amorphous silicon can be preferably used in terms of its cost, manufacture in large area, the magnitude of an energy gap, and the like. Note that the photoelectric conversion layer 12 is also referred to simply as a power generating element.

The transparency of the back electrode 13 is not so required. Therefore, a metal having a normal conductivity can be used. Specifically, Al, or Ag can be preferably used. The back electrode is the second electrode.

A solar battery cell 20 is formed by the above-described transparent electrode 11, photoelectric conversion layer 12, and back electrode 13 formed on the substrate 10. A plurality of solar battery cells may be formed on the substrate 10, and they can be connected together in series or in parallel by respectively connecting the transparent electrodes and the back electrodes of the solar battery cells.

Figure 2:
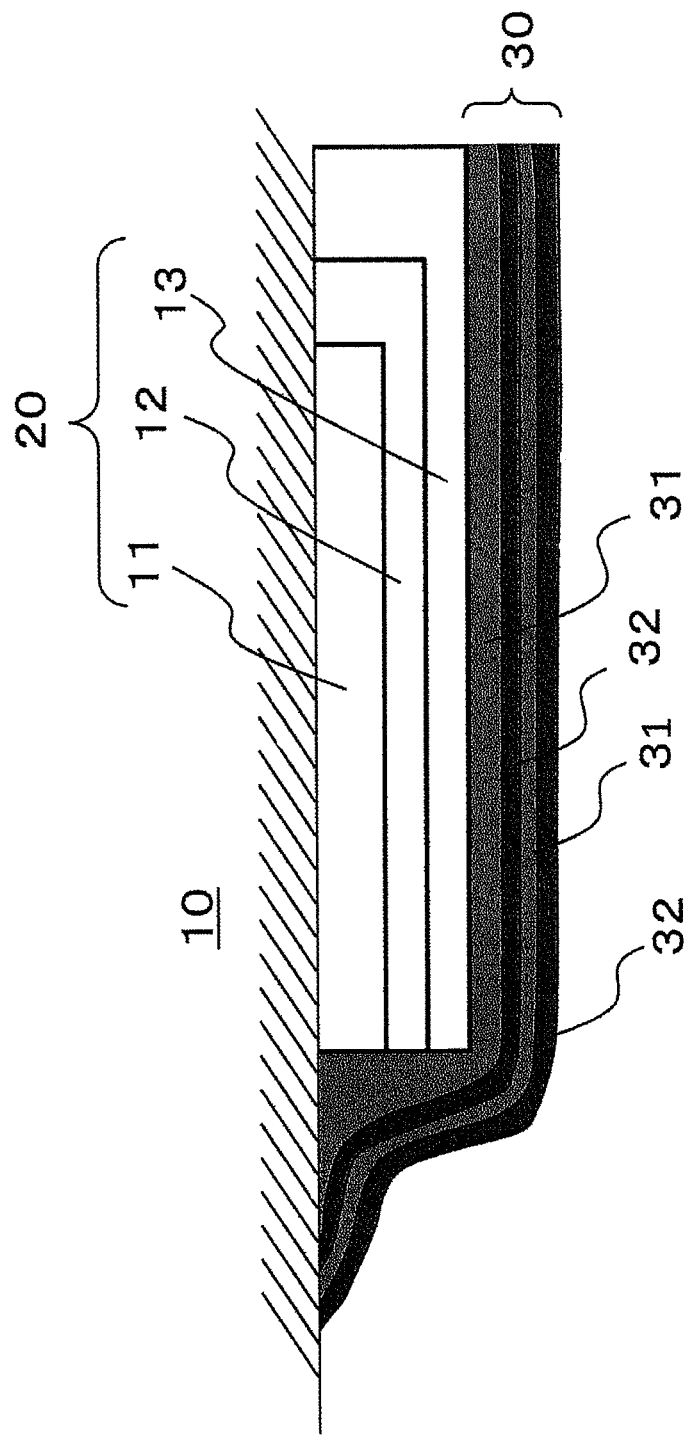
FIG. 2 is an enlarged cross-sectional view showing a boundary portion between a substrate and a solar battery cell.

Next, the barrier layer 30 composed of inorganic substances is formed on the solar battery cell 20 formed on the substrate 10. FIG. 2 shows an enlarged view of the barrier layer 30. The barrier layer 30 at least needs to include a portion in contact with the substrate 10. Preferably, the barrier layer 30 needs to be disposed so as to cover at least between the substrate 10 and the second electrode 13. This is to prevent the entering of water from a side surface direction of the solar battery cell 20. It is more preferable to form the barrier layer 30 so as to cover the entire back surface of the solar battery cell 20 and the substrate. This is because the entering of water from the back surface direction can be also prevented.

The barrier layer 30 has a structure in which a plurality of inorganic layers are deposited. Therefore, it is required that the barrier layer 30 is formed by at least two types of layers with different densities. It is also necessary that the densities of these layers are different from each other. A first thin film layer 31 directly in contact with the substrate 10 and the solar battery cell 20 is formed by an inorganic layer having a low density, and a second thin film layer 32 is formed thereon using an inorganic substance having a high density. This is because the inorganic layer having a low density has a smaller stress on the foundation as compared to the inorganic layer having a high density, and the first and second electrodes, the power generating element, and the like to be foundation can be therefore prevented from peeling from the substrate.

$SiO_2$ can be used for the inorganic layer having a high density. An $SiO_2$ film is dense, and can effectively prevent water from entering therethrough. In FIG. 2, it is the second thin film layer 32. In order to effectively prevent the entering of water, a density of the inorganic substance is preferably 2 $g/cm^3$ or larger. Therefore, if the density is 2 $g/cm^3$ or larger, an inorganic substance other than $SiO_2$ may be used.

Types of the inorganic layers forming the barrier layer 30 are not particularly limited. It is only necessary that they are at least two types of inorganic layers having different densities and there exists at least one layer having a density of 2 $g/cm^3$ or more. Therefore, as shown in FIG. 2, the barrier layer may be configured by combining three or more types of inorganic layers.

Moreover, thickness configuration of each of the inorganic layers is not particularly limited. In the barrier layer 30, the thickness of the inorganic layer having a low density may be increased in a portion close to the foundation side, and the thickness of the inorganic layer having a high density may be increased as the thickness of the barrier layer increases. Moreover, the boundary between inorganic layers does not have to be clear. That is, the barrier layer may be configured by repeating a structure continuously changing from the inorganic layer having a low density to the inorganic layer having a high density.

Also, the number of times of deposition is performed is not particularly limited. If the number of times of deposition is performed is large, however, the number of steps is increased. Thus, a tact time for producing one solar battery module is increased. For example, in FIG. 2, the first thin film layer 31 is an inorganic layer having a low density, and a second thin film layer 32 is an inorganic layer having a high density. Although only two first thin film layers 31 and one second thin film layer 32 are shown, these may be formed by a multilayer film obtained by performing depositing for more number of times.

Although a method for producing the barrier layer 30 is not particularly limited, since a deposition object is constantly exposed to plasma in a sputtering method or an ECR (electron cyclotron resonance) CVD (chemical vapor deposition) method, a method such as a thermal CVD method, an optical CVD method, or a plasma CVD method is preferably used.

Returning to FIG. 1, the sealing layer 15 and the protective layer 16 may be formed after the formation of the barrier layer 30. As the sealing layer 15, conventionally-used EVA may be used. Moreover, as the protective layer 16, a conventionally-used polyvinyl fluoride resin or a composite film such as polyvinyl fluoride resin/Al/polyvinyl fluoride resin may be used. Moreover, a frame 17 is fixed to a side surface of the solar battery module 1 using a seal.

Figure 3:
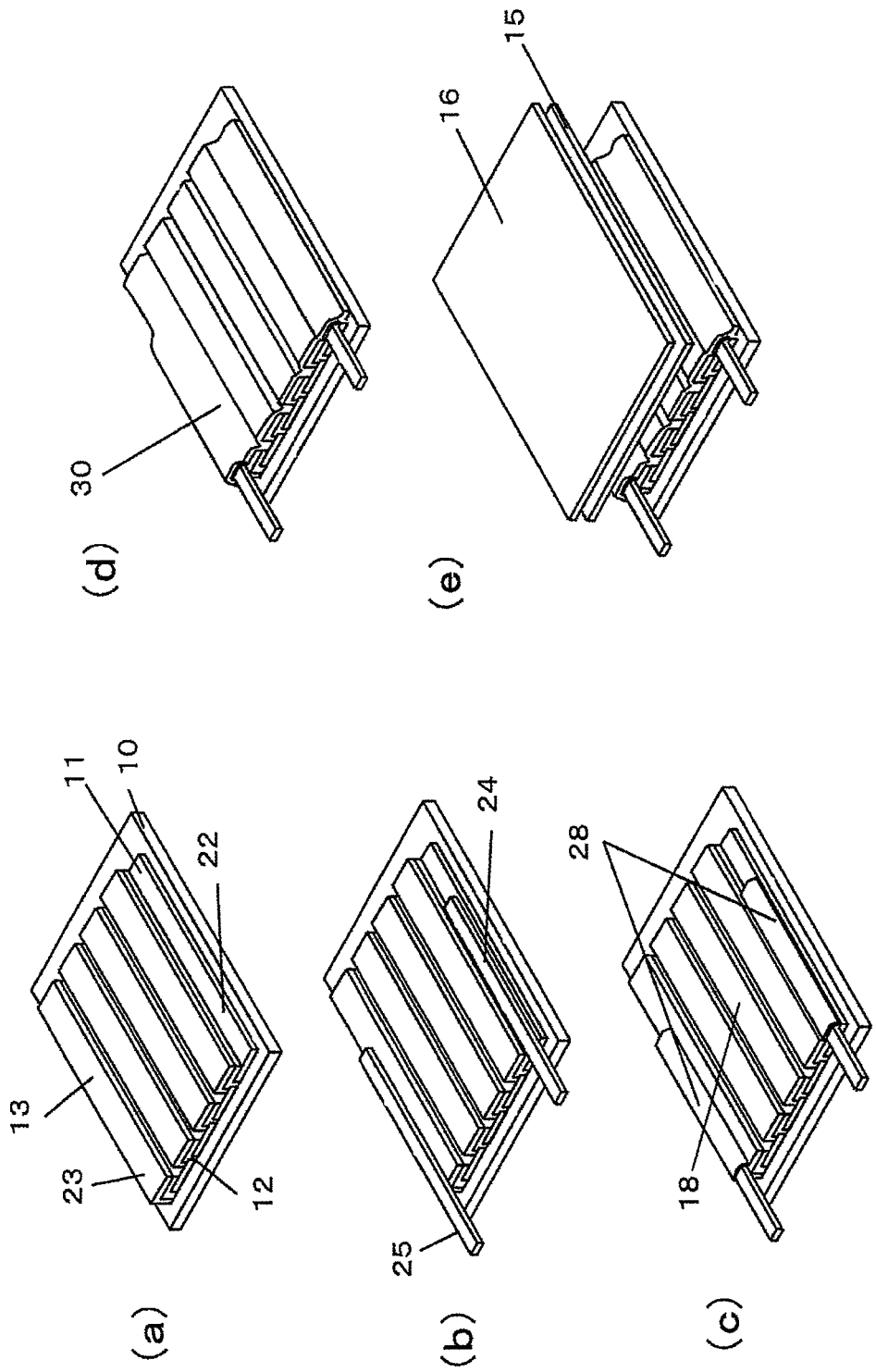
FIG. 3 is a diagram illustrating a manufacturing process of the solar battery module of the present invention.

FIG. 3 briefly shows a manufacturing process of an entire solar battery module in the present invention. FIG. 3(a) shows a state where the transparent electrode layer 11, the power generating element 12, and the back electrode 13 are formed on one substrate 10. A plurality of power generating elements 12 are simultaneously formed, and are connected in series or in parallel depending on a pattern of the transparent electrode 11 and the back electrode 13. Herein, electrode ends 22 and 23 of the solar battery module 1 are gathered on both sides of the module. Note that the electrode ends may be provided at a place other than the both sides of the module.

FIG. 3(b) shows a state where extraction terminals 24 and 25 are provided at the two electrode ends 22 and 23. The extraction terminals 24 and 25 are portions to be a positive electrode and a negative electrode of the solar battery module 1. A material used therefor is not particularly limited. A metal which is less likely to corrode and has a high conductivity or an alloy material can be preferably used.

FIG. 3(c) shows a state of a coating formed portion 28 being formed of resin to eliminate gaps at portions where the extraction terminals 24, 25 and the electrode ends 22 and 23 are respectively connected, wherein the resin is applied in a flat or gently sloped form filling the level differences between the extraction terminal 24 and the substrate 10, and between the extraction terminal 25 and the second electrode 13 (back electrode). The reason why the connections between the extraction terminals 24 and the electrode ends 22, and between the extraction terminals 25 and electrode ends 23 are covered with the resin is that if the CVD method is used, a level difference cannot be covered with a continuous deposit due to its poor step coverage. Note that the coating formed portion 28 may cover not only the extraction terminals 24 and 25 but also the entire surface of the solar battery cell 20.

FIG. 3(d) shows a state where the barrier layer 30 is formed on the coating formed portion 28. Since the purpose of providing the barrier layer 30 is to prevent water from entering from the side surface of the substrate, the barrier layer 30 is disposed so as to integrally cover the substrate 10, the coating formed portion 28, and the second electrode 13. Therefore, although it is preferable that the barrier layer 30 cover all the region containing these, the barrier layer 30 may be placed only at a boundary portion with the substrate 10 where water is most likely to be entered. That is, the barrier layer 30 may not be disposed at a central portion (reference numeral 18 in FIG. 3(c)) of the solar battery module 1.

FIG. 3(e) shows a state where EVA is formed on the barrier layer 30 as the sealing layer 15, and a protective film is formed thereon as the protective layer 16. After covered with EVA and the protective film, the side surfaces are protected by the frames 17 (see FIG. 1).

EXAMPLES

Next, an example in which the solar battery of the present invention was actually produced will be described. A typical glass substrate was used as the substrate. The size thereof was 400 mm in length, 300 mm in width, and 3.5 mm in thickness.

A transparent electrode made of ITO having a thickness of 1 μm was formed in a predetermined shape on the glass substrate. An amorphous silicon photoelectric conversion layer having pin junction was formed on the transparent electrode so that a part thereof was connected. Further, the back electrode in which ZnO and Ag were deposited was formed on the photoelectric conversion layer. Thus, the solar battery cell was formed on the substrate. Next, the barrier layer was formed on this substrate.

Figure 4:
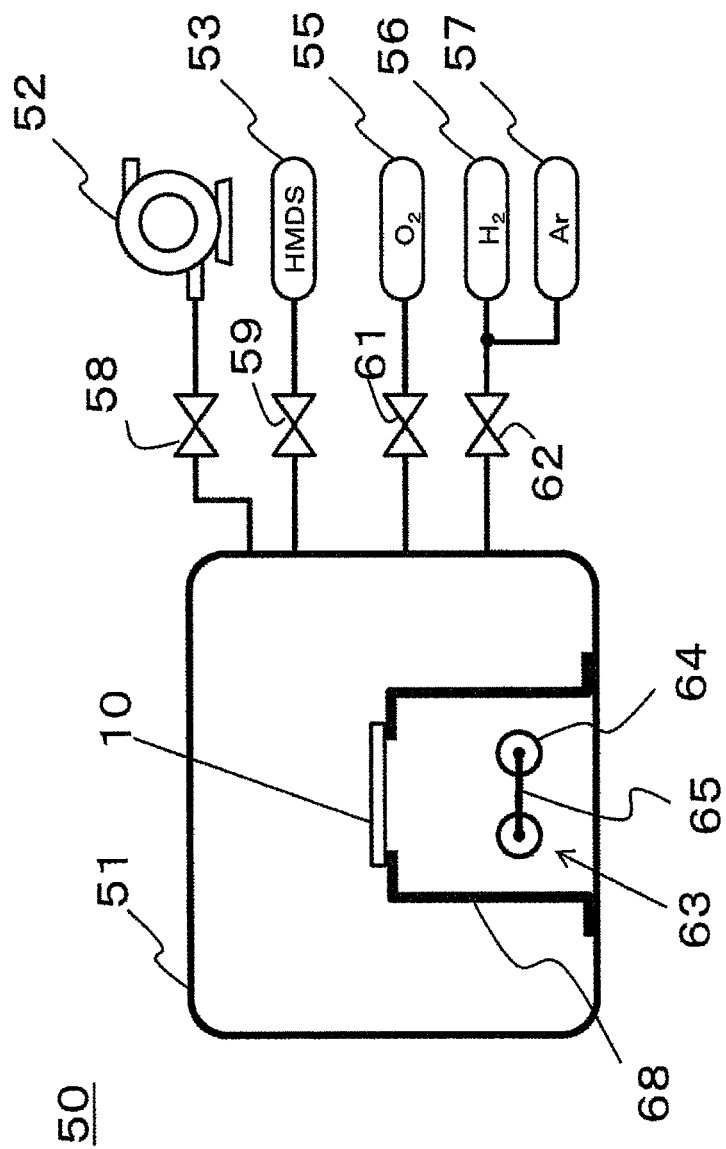
FIG. 4 is a cross-sectional view showing a configuration of a barrier layer deposition device.

The barrier layer 30 was produced by using a barrier layer forming device. FIG. 4 (side cross-sectional view) and FIG. 5 (plan view) are configuration diagrams of the barrier layer forming device. In a barrier layer forming device 50, there are disposed a vacuum chamber to be a deposition chamber 51, an exhaust system 52 formed by a rotary pump and a turbo-molecular pump, a high-frequency power source 66 for plasma generation, and flanges for introducing various gases.

The deposition chamber 51 is connected to the exhaust system 52, an HMDS supply tank 53, an $O_2$ supply tank 55, an $H_2$ supply tank 56, and an Ar supply tank 57. The deposition chamber 51 is connected to the exhaust system 52 via a flow control valve 58, connected to the HMDS supply tank 53 via a flow control valve 59, connected to the $H_2$ supply tank 56 and the Ar supply tank 57 via a flow control valve 62, and connected to the $O_2$ supply tank 55 via a flow control valve 61. A loop antenna 63 is provided inside the deposition chamber 51.

Figure 5:
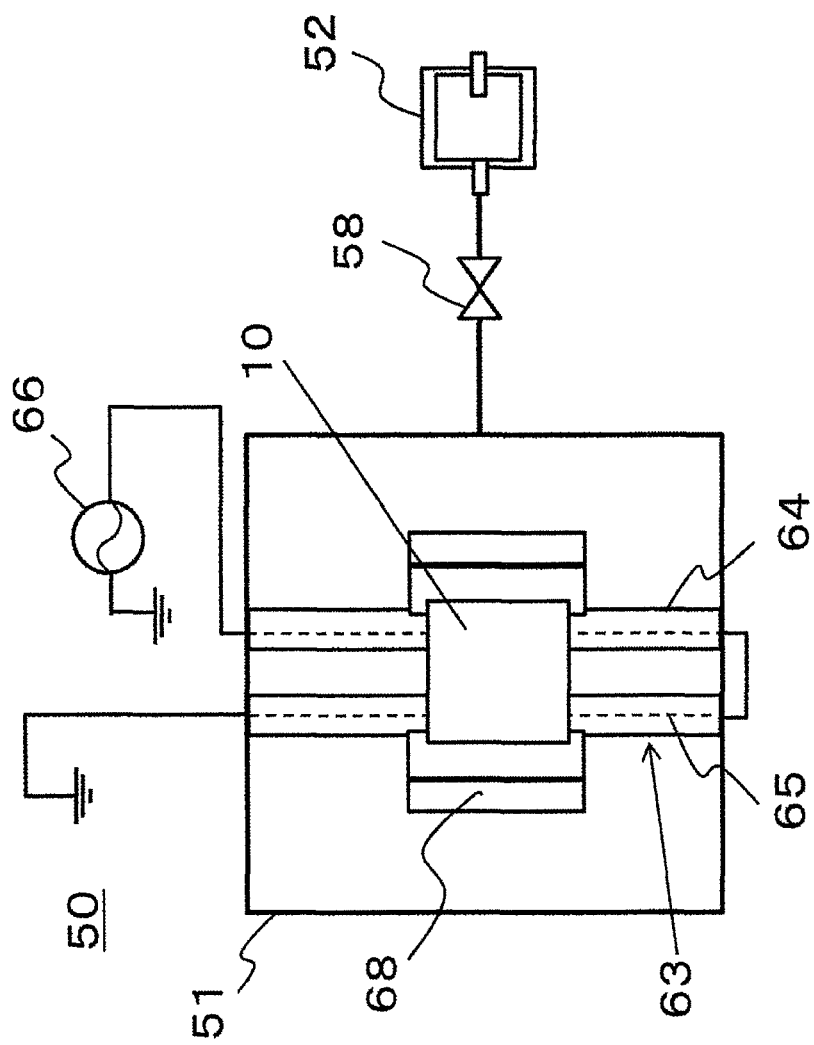
FIG. 5 is a plan view showing the configuration of the barrier layer deposition device.

The loop antenna 63 is means for generating plasma, and formed by insulating tubes 64 and a conductive electrode 65. The two insulating tubes 64 are disposed in parallel inside the deposition chamber 51 so as to face each other. The conductive electrode 65 is disposed in a manner such that it is inserted through the two insulating tubes 64. As shown in FIG. 5, the conductive electrode 65 runs through the opposing side walls of the deposition chamber 51 so as to have an approximately U-shape as seen in a plan view, and is connected to a high-frequency power source 66 for supplying a high-frequency current. A frequency of the high-frequency power source 66 is preferably 13.56 MHz. Note that the plasma to be used may be CCP, ICP, barrier discharge, hollow discharge, or the like.

The substrate 10 on which the solar battery cell 20 had been formed was placed on a substrate fixing base 68 so that the solar battery cell faces the loop antenna 63 side. Next, an inner pressure of the deposition chamber 51 was depressurized by the exhaust system 52 to be $9.9 \times 10^{-5}$ Pa or lower.

After the depressurization in the deposition chamber 51 was completed, the flow valve 62 was opened to fill mixed gas of $H_2$ gas and Ar gas into the deposition chamber 51. At the same time, the flow valve 59 was opened to fill HMDS (hexamethyldisilazane) gas into the deposition chamber 51. By adding Ar gas, it becomes possible to cause a dissociation reaction with plasma having a relatively small energy. Filling rates of the respective gases at this point were 20 sccm to 40 sccm for mixed gas of $H_2$ gas and Ar gas, and 3 sccm to 5 sccm for HMDS gas.

Subsequently, a high-frequency current was flowed through the loop antenna 63 from the high-frequency power source 66. As a result, plasma was generated around the loop antenna 63. The electric power of plasma at this point was 5 kW to 10 kW. A surface reaction occurred on the surface of the substrate, and the first thin film layer 31 covering the solar battery cell 20 shown in FIG. 2 was formed. After a passage of a predetermined period of time T1, the flow valve 62 was closed to stop the filling of the mixed gas of $H_2$ gas and Ar gas.

After the formation of the first thin film layer 31, a process of forming the second thin film layer 32 was performed. First, the flow valve 61 was opened to fill $O_2$ gas into the deposition chamber 51. At the same time, HMDS gas was filled by the flow valve 59. Filling rates of the respective gases at this point were 20 sccm to 1000 sccm for $O_2$ gas, and 3 sccm to 20 sccm for HMDS gas.

Subsequently, a high-frequency current was flowed through the loop antenna 63 from the high-frequency power source 66 so that the electric power of plasma was 0.1 kW to 8 kW. As a result, plasma was generated around the loop antenna 63.

A surface reaction occurred on the surface of the substrate, and the second thin film layer 32, i.e., a silicon oxide film, was formed so as to cover the first thin film layer 31 as shown in FIG. 2. After a passage of a predetermined period of time, the flow valve 61 was closed to stop the filling of $O_2$ gas. The silicon oxide film preferably contains Si and O in a composition ratio of Si:O=1:1.9 to 2.1.

The above-described processes performed for the first thin film layer 31 and the second thin film layer 32 were repeated N times (N=2 in this example). As a result, as shown in FIG. 2, there were obtained two deposits, each of which includes the silicon oxide film (second thin film layer 32) deposited on the low-density thin film containing silicon (first thin film layer 31).

As described above, first, the first thin film layer 31 was formed on a substrate K with a plasma CVD method using $H_2$ gas, Ar gas, and HMDS gas as material gases. Next, $O_2$ gas and HMDS gas were used to form the second thin film layer 32, which is a silicon oxide film, on the first thin film layer 31. Note that although not shown herein, $NH_3$ gas, $SiH_4$ gas, and the like may be used to include a silicon nitride film.

It was found out that the first thin film layer 31 had excellent adhesiveness. By interposing the first thin film layer 31 between the substrate 10 and the second thin film layer 32, adhesiveness between the substrate 10 and the second thin film layer 32 and that with the subsequent film are improved. As a result, the second thin film layer 32 is less likely to cause crack or peel-off, thereby achieving reliability with small variation in performance.

Moreover, by alternately depositing the first thin film layer 31 and the second thin film layer 32 in plurality of times, the barrier property against water or oxygen is significantly improved. Note that although the description has been made in the present embodiment using an example in which two inorganic layers are deposited, inorganic layers using three or more types of inorganic substances may be used.

The thus produced solar battery module of the present invention had high airtightness against water, and had an improved waterproof property in a thermal cycling test as compared to a case where a back surface thereof was sealed only with EVA and a protective layer.

According to the method of the present invention, since an etching process or the like is not used unlike a conventional technique, the solar battery cell 20 is not damaged. Moreover, the deposit of the first thin film layer 31 and the second thin film layer 32 comes to also have a function of protecting the solar battery cell 20 from a plasma energy as it is grown with CVD on the substrate 10, thereby resulting in a less damage to the device due to the plasma energy. Moreover, since the formation of the first thin film layer 31 and the formation of the second thin film layer 32 are performed inside the same chamber (the deposition chamber 51), the device configuration does not become extensive. Moreover, since HMDS gas is used as a material gas, there is no possibility of explosion, and its safety is therefore excellent.

Note that the present invention is not limited to the above-described embodiment, and can be applied also in other embodiments reflecting the spirit of the present invention. For example, unlike an amorphous solar battery in the above-described embodiment, in a CIGS solar battery, sunlight is received by the opposite side of a solar cell (the back surface side in the present specification) from a glass substrate side. Accordingly, as for the arrangement of the first electrode (the transparent electrode) and the second electrode (the metal electrode), the transparent electrode is used on the back surface side, and the metal electrode may be used on the glass substrate side.

As above, descriptions about materials used for the electrodes will be different from those in the embodiment of the present specification, i.e., the descriptions will be reversed. However, even in a case of the CIGS solar battery, the present invention may be applied by using the electrode on the glass substrate side as the first electrode, and using that on the back surface side as the second electrode.

INDUSTRIAL APPLICABILITY

In addition to a solar battery module, the present invention can be widely expanded to techniques for isolating an object formed on a solid such as a glass from water.

REFERENCE SIGNS LIST 1 solar battery module
10 substrate
11 transparent electrode layer
12 photoelectric conversion layer
13 back electrode layer
15 sealing layer
16 protective layer
17 side surface sealing material
20 solar battery cell
22 electrode end
23 electrode end
24 extraction terminal
25 extraction terminal
28 coating formed portion
30 barrier layer
31 first thin film layer
32 second thin film layer 50 barrier layer forming device
51 deposition chamber
52 exhaust system
53 HMDS supply tank
55 $O_2$ supply tank
56 $H_2$ supply tank
57 Ar supply tank
58-62 flow control valve
63 loop antenna
64 insulating tube
65 conductive electrode
66 high-frequency power source
68 substrate fixing base

The invention claimed is:
1. A solar battery comprising:
a substrate;
a first electrode formed on the substrate;
a power generating element formed so as to be connected with the first electrode;
a second electrode formed so as to be connected with the power generating element;
an inorganic barrier layer including portions at least in contact with the substrate and the second electrode;
a first extraction terminal connected to the first electrode;
a second extraction terminal connected to the second electrode; and
a resin portion that directly contacts and seals the first extraction terminal and the second extraction terminal;
wherein the portions of the inorganic barrier layer connect with each other and extend over the resin portion such that the inorganic barrier layer is continuous as it extends over and is in direct physical contact with the substrate, the second electrode, and the resin portion; and
wherein the barrier layer includes a first inorganic layer that is directly formed on the substrate and the second electrode, and a second inorganic layer which has a higher density than the first inorganic layer and is directly formed on the first inorganic layer.

2. The solar battery according to claim 1, wherein the barrier layer is formed by sequentially depositing a plurality of inorganic layers having different densities.

3. The solar battery according to claim 1, further comprising:
an adhesion layer having a portion in contact at least with the barrier layer; and
a protective layer provided on the adhesion layer.

4. The solar battery according to claim 1, wherein the second inorganic layer comprises $SiO_2$.

* * * * *